United States Patent
Kwak et al.

(10) Patent No.: US 6,870,783 B2
(45) Date of Patent: Mar. 22, 2005

(54) MODE ENTRANCE CONTROL CIRCUIT AND MODE ENTERING METHOD IN SEMICONDUCTOR MEMORY DEVICE

(75) Inventors: Choong-Keun Kwak, Suwon (KR); Bo-Tak Lim, Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 1 day.

(21) Appl. No.: 10/661,581

(22) Filed: Sep. 15, 2003

(65) Prior Publication Data
US 2004/0085837 A1 May 6, 2004

(30) Foreign Application Priority Data
Oct. 30, 2002 (KR) ................................ 10-2002-0066482

(51) Int. Cl.[7] .......................................... G11C 11/4193
(52) U.S. Cl. .............. 365/201; 365/189.07; 365/189.09
(58) Field of Search ........................... 365/201, 189.07, 365/189.03, 189.09

(56) References Cited

U.S. PATENT DOCUMENTS

| | | | | |
|---|---|---|---|---|
| 5,367,491 A | * | 11/1994 | Han et al. ................... | 365/201 |
| 5,373,472 A | * | 12/1994 | Ohsawa ...................... | 365/201 |
| 5,896,324 A | * | 4/1999 | Jang et al. ............. | 365/189.07 |
| 6,121,806 A | * | 9/2000 | Kono et al. ................. | 327/205 |
| 6,522,589 B1 | * | 2/2003 | Miyakawa et al. ..... | 365/189.07 |
| 2002/0069026 A1 | * | 6/2002 | Endo .......................... | 702/117 |
| 2003/0026139 A1 | * | 2/2003 | Endo et al. ................. | 365/200 |
| 2003/0135801 A1 | * | 7/2003 | Chevallier .................. | 714/724 |

* cited by examiner

*Primary Examiner*—Anh Phung
*Assistant Examiner*—J. H. Hur
(74) *Attorney, Agent, or Firm*—Lee, Sterba & Morse P.C.

(57) ABSTRACT

In a mode entrance control circuit and a mode entering method to stably enter a semiconductor memory device into a predetermined operating mode only when insensitive to a change of a process, temperature, or voltage, etc., and simultaneously satisfying a constant entrance condition, the mode entrance control circuit includes an operation control part for generating an operation enable signal when a first voltage applied through a first pad is over a first determination voltage, a voltage division part for dividing a second voltage applied through a second pad to generate a trimming reference voltage, and a mode entrance signal generating part operated in response to the operation enable signal, for comparing a level of an applied fixed reference voltage with a level of the trimming reference voltage, and for generating a mode entrance enable signal to allow the semiconductor memory device to enter into a predetermined mode.

14 Claims, 3 Drawing Sheets

MODE ENTRANCE CONTROL CIRCUIT AND MODE ENTERING METHOD IN SEMICONDUCTOR MEMORY DEVICE

BACKGROUND OF THE INVENTION

1. Field of the Invention

The present invention relates to a semiconductor device. More particularly, the present invention relates to a mode entrance control circuit and a mode entering method.

2. Description of the Related Art

Operation of most circuits existing within a semiconductor memory device depends upon a change of a process, a temperature, or a voltage, for example. Thus, if a functional circuit depends on a voltage change to enter into a specific operating mode, such as a test operating mode, a function may not be smoothly performed. For example, in a mode entrance control circuit, if a process, temperature, or voltage, etc., required to enter into a test mode has much change, the mode entrance may fail, thereby rendering a semiconductor memory device difficult to operate in the determined test mode.

Therefore, a mode entrance technology in which a semiconductor memory device may be stably entered into a predetermined operating mode, only when the semiconductor memory device is insensitive to a change of a process, a temperature, or a voltage, etc., and simultaneously satisfying a constant entrance condition, is greatly required.

SUMMARY OF THE INVENTION

In an effort to solve the problems mentioned above, a mode entrance control circuit and a mode entering method of a semiconductor memory device are provided, to enable a semiconductor memory device to stably enter a predetermined operating mode only when the semiconductor memory device is insensitive to a change in a process, a temperature, or a voltage, etc., and to simultaneously satisfy a constant entrance condition.

An embodiment of the present invention also provides a mode entrance control circuit and a mode entering method of a semiconductor memory device for controlling a mode entrance allowance condition through a fuse trimming.

Therefore, it is a feature of an embodiment of the present invention to provide a mode entrance control circuit of a semiconductor memory device including an operation control part for generating an operation enable signal when a first voltage applied through a first pad is over a first determination voltage, a voltage division part for dividing a second voltage applied through a second pad to generate a trimming reference voltage, and a mode entrance signal generating part operated in response to the operation enable signal, for comparing a level of an applied fixed reference voltage with a level of the trimming reference voltage and for generating a mode entrance enable signal that allows the semiconductor memory device to enter into a predetermined mode.

Preferably, a level of the first and second voltages is higher than that of an operation voltage source of the semiconductor memory device, and the level of the second voltage may be higher than the level of the first voltage or equal to the level of the first voltage.

The mode entrance signal generating part preferably includes a differential amplifier of a current mirror type for amplifying a difference between the level of the fixed reference voltage and the level of the trimming reference voltage in response to the operation enable signal.

The operation control part preferably includes a PMOS transistor and a plurality of NMOS transistors having source-drain or drain-source channels connected in series between the first pad and ground, an inverter connected to the drain of the PMOS transistor, and an output inverter for inverting an output of the inverter.

Preferably, the voltage division part includes a plurality of PMOS and NMOS transistors having source-drain or drain-source channels connected in series between the second pad and ground and upper fuses and lower fuses which may be cut by a light source.

Preferably, the mode entrance signal generating part is constructed of a differential amplifier of a current mirror type, which preferably includes PMOS transistors having sources that receive in common the operation voltage source and having gates that are connected with each other, NMOS transistors having drains that are respectively connected with drains of the PMOS transistors, and an NMOS transistor having a drain that is coupled with a common source of the NMOS transistors, a source that is grounded, and a gate that receives the operation enable signal.

A mode entrance may be allowed only when a voltage higher than a previous voltage is applied when a cutting number of the upper fuses, or number of times the upper fuses are cut, is increased.

It is another feature of an embodiment of the present invention to provide a method of generating a mode entrance control signal in a semiconductor memory device including preparing a trimming reference voltage determination part composed of a plurality of MOS transistors and fuses, determining a trimming reference voltage by cutting the fuses, applying a first voltage over a first determination voltage through a first pad and generating an operation enable signal, applying a second voltage through a second pad and generating the trimming reference voltage, comparing a level of an applied fixed reference voltage with a level of the trimming reference voltage during the generation of the operation enable signal, and generating a mode entrance enable signal that allows the semiconductor memory device to enter into a predetermined mode.

Preferably, a level of the first and second voltages is higher than that of an operation voltage source of the semiconductor memory device, and the level of the second voltage may be higher than or equal to the level of the first voltage.

In an embodiment of the present invention, the fixed reference voltage is a reference voltage generated from a reference voltage generator of the semiconductor memory device.

The mode entrance control circuit and method of the present invention allows a semiconductor memory device to be stably entered into a predetermined operating mode only when the semiconductor memory device is insensitive to a change of a process, a temperature, or a voltage, etc., while simultaneously satisfying a constant entrance condition.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE PREFERRED EMBODIMENTS

Korean Patent Application No. 2002-66482, filed on Oct. 30, 2002, and entitled: "Mode Entrance Control Circuit And Mode Entering Method In Semiconductor Memory Device," is incorporated by reference herein in its entirety.

The present invention will be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
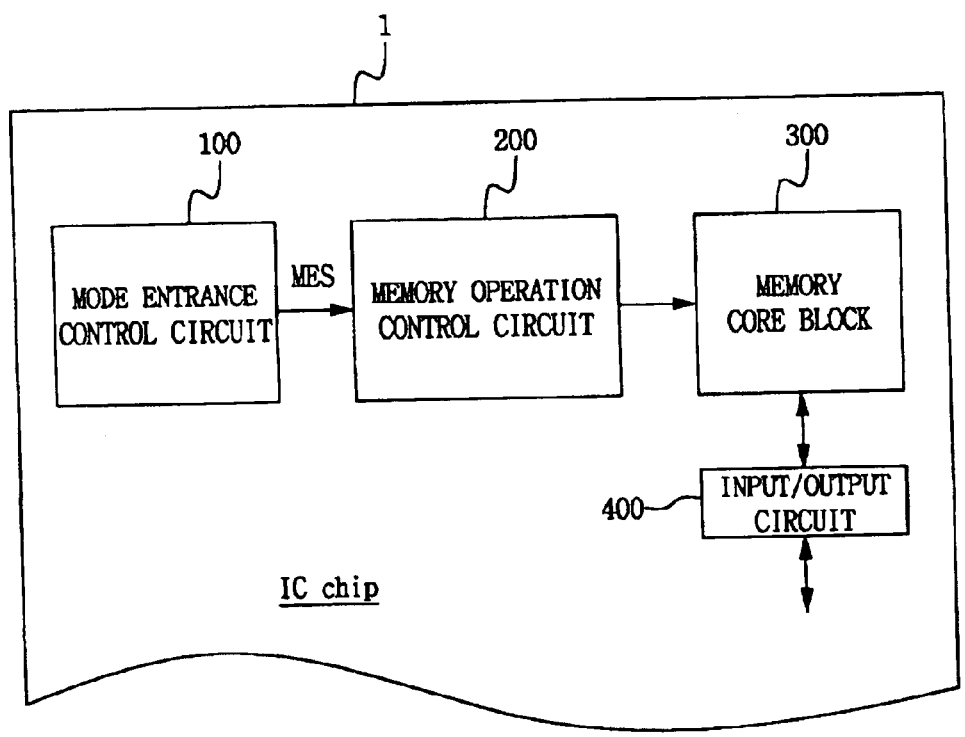
FIG. 1 illustrates a block diagram of a semiconductor memory device in accordance with the present invention.

FIG. 1 shows a block diagram of a semiconductor memory device in accordance with the present invention.

Referring to FIG. 1, a mode entrance control circuit 100 mounted in an integrated circuit chip 1 is connected to a memory operation control circuit 200, and generates a mode enable signal MES.

The memory operation control circuit 200 controls a memory core block 300 as a specific operating mode, e.g., a test operation, when the mode enable signal has a predetermined level. Thereby, the memory core block 300 does not operate a normal operation, but operates in the specific operating mode, e.g., memory core block 300 operates a read or write concern operation in the test operation mode.

An input/output circuit 400 is coupled with the memory core block 300, and provides data inputted or outputted in the test mode or the normal operating mode to the memory core block 300 or to an external data processing device.

That is to say, an output state of the mode entrance control circuit 100 decides an operating mode of the memory core block 300, to thus require a considerably stabilized state without sensitivities to a change in a process, a temperature, or a voltage, etc.

In the exemplary embodiment of the present invention, mode entrance is allowed only when a high voltage higher than an operation voltage source is applied to mode entrance pads. A mode entrance control circuit capable of optionally changing, through a fuse trimming, a trip point of a voltage level for performing such a mode entrance is shown in FIG. 2.

Figure 2:
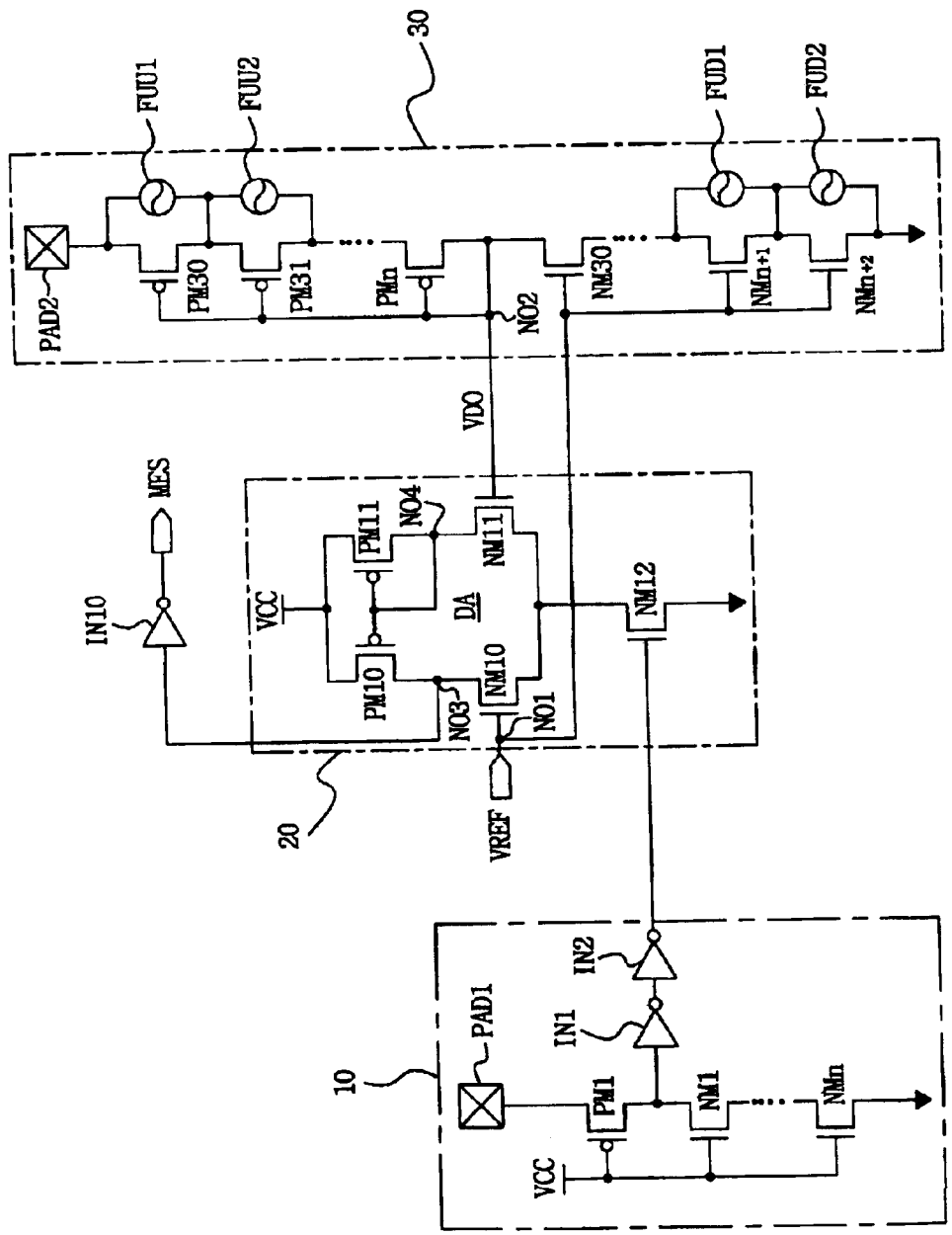
FIG. 2 illustrates a circuit diagram of a mode entrance control circuit in accordance with the present invention.

FIG. 2 illustrates a circuit diagram of the mode entrance control circuit in accordance with an exemplary embodiment of the present invention.

With reference to FIG. 2, the mode entrance control circuit of the semiconductor memory device is constructed of an operation control part 10, a voltage division part 30 and a mode entrance signal generating part 20.

The operation control part 10 includes a P-type MOS (PMOS) transistor PM1 and a plurality of N-type MOS (NMOS) transistors NM1-NMn, having source-drain or drain-source channels connected in series between a first pad PAD1 and ground, and having gates connected to operation voltage source VCC. The operation control part 10 also includes an inverter IN1 connected to the drain of the PMOS transistor PM1, and an inverter IN2 for inverting an output of the inverter IN1, to generate an operation enable signal when a first voltage applied through the first pad PAD1 is more than a first determination voltage.

The voltage division part 30 includes a plurality of PMOS and NMOS transistors PM30-PMn, NM30-NMn+2, having source-drain or drain-source channels connected in series between a second pad PAD2 and ground, and upper fuses FUU1, FUU2 and lower fuses FUD1, FUD2, which may be cut by a light source such as a laser beam, etc., to divide a second voltage applied through the second pad PAD2 and to generate a trimming reference voltage VDO.

The mode entrance signal generating part 20 operates in response to the operation enable signal outputted from the operation control part 10.

The mode entrance signal generating part 20 compares a level of an applied fixed reference voltage VREF with a level of the trimming reference voltage VDO, and generates the mode entrance enable signal MES through an inverter IN10, the mode entrance enable signal MES being for enabling an operation of the semiconductor memory device to enter into a predetermined mode.

The mode entrance signal generating part 20 may be constructed of a differential amplifier DA of a current mirror type, and includes PMOS transistors PM10, PM11 having sources that receive in common an operation voltage source VCC, and having gates that are connected with each other; NMOS transistors NM10, NM11, having drains that are respectively, correspondingly, connected with drains of the PMOS transistors PM10, PM11; and an NMOS transistor NM12 having a drain connected to a common source of the NMOS transistors NM10, NM11, a source that is grounded, and a gate that receives the operation enable signal outputted from the operation control part 10.

In FIG. 2, a node NO1 becomes an input terminal to which the fixed reference voltage VREF of the differential amplifier DA is applied, a node NO2 becomes an input terminal to which the trimming reference voltage VDO is applied, a node NO3 becomes a first output terminal of the differential amplifier DA, and a node NO4 becomes a second output terminal of the differential amplifier DA.

In an embodiment of the present invention, the mode entrance enable signal MES is generated through the first output terminal.

A semiconductor memory device such as an SRAM, etc., usually employs an internal voltage down converter for converting an external voltage source into a constant internal voltage source and supplying the converted internal voltage to a required place of a chip interior. Thus, a semiconductor memory device is almost indispensably equipped with a reference voltage generator for providing a constant reference voltage to the internal voltage down converter.

Therefore, a reference voltage generated from the reference voltage generator is used for the fixed reference voltage VREF applied to the node NO1 of FIG. 2, so that the reference voltage, as a standard of a differential comparison, is not heavily influenced by a change in internal or external environment, such as a process, a temperature, or a voltage, etc.

In FIG. 2, the trimming reference voltage VDO generated from the voltage division part 30 is applied to the node NO2. A level of the trimming reference voltage VDO depends upon a resistance ratio of the plurality of PMOS and NMOS transistors PM30-PMn, NM30-NMn+2 decided by a cutting number of the upper fuses FUU1, FUU2 and the lower fuses FUD1, FUD1.

If the upper fuses are cut to thereby heighten an upper resistance between the second pad PAD2 and the node NO2, the level of the trimming reference voltage VDO becomes low. If the lower fuses are cut to thereby heighten a lower resistance between the node NO2 and ground, the level of the trimming reference voltage VDO becomes high.

When cutting the upper fuses, an applied voltage of the second pad PAD2, namely, an externally applied voltage, has a high level. When cutting the lower fuses, a level of the applied voltage of the second pad PAD2 has a low level.

Thus, if mode entrance is to be allowed only when the high voltage is applied to the second pad PAD2, the upper fuses are cut in a fuse trimming process. If mode entrance is to be allowed only when a voltage relatively lower than the high voltage is applied to the second pad PAD2, the lower fuses are cut.

Figure 3:
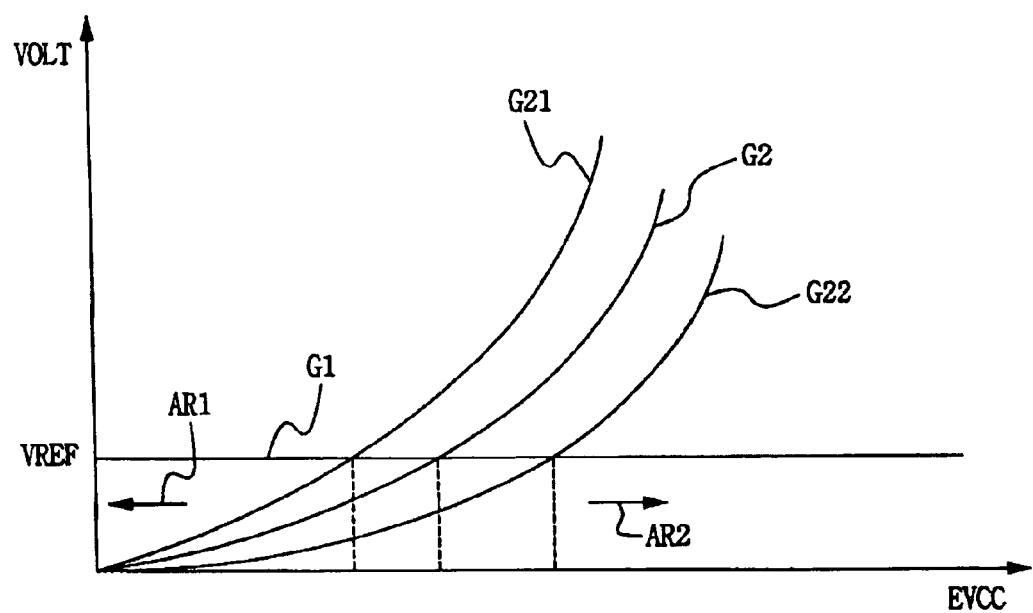
FIG. 3 is a graph diagram showing operations of FIG. 2.

FIG. 3 is a graph showing operations of FIG. 2, and will therefore be described with reference to both FIGS. 2 and 3.

In the graph of FIG. 3, a transverse axis represents an external voltage source EVCC, and a longitudinal axis indicates a voltage VOLT. A graph G1 illustrates a waveform of the fixed reference voltage VREF. Graphs G2, G21, G22 respectively represent waveforms of the trimming reference voltages VDO controlled by cutting the fuses.

The fixed reference voltage VREF has a constant level regardless of a change in the external voltage source EVCC, as shown in a shape of the graph G1, and is applied to the node NO1 of FIG. 2.

In the meantime, in the graphs G2, G21, G22, if the lower resistance between the node NO2 and ground is heightened by cutting the lower fuses, the trimming reference voltage VDO becomes high. Therefore, an applied voltage of the second pad PAD2, namely, the externally applied voltage, may be low.

Graph G21 is based on graph G2, but graph G21, which is shifted toward an arrow mark AR1, is obtained by cutting the lower fuses further than the lower fuses were cut in obtaining the graph G2. Alternatively, in a case that the upper resistance between the second pad PAD2 and the node NO2 is heightened by cutting the upper fuses, the trimming reference voltage VDO becomes low. Thus, an applied voltage of the second pad PAD2, namely, the externally applied voltage, may be high.

Graph G22 is based on graph G2, but the graph G22, which is shifted toward an arrow mark AR2, is obtained by cutting the upper fuses further than the upper fuses were cut in obtaining the graph G2.

That is, the further a graph is shifted toward the arrow mark AR2, the higher a cutting number of the upper fuses, and the higher a level of voltage to be applied to the pad becomes. That is, the level of voltage to be applied to the pad increases with each successive cutting of the upper fuses, and a graph representative thereof shifts further toward the arrow AR2. Alternatively, the more a graph moves toward the arrow mark AR1, the higher a cutting number of the lower fuses, and the lower a level of voltage to be applied to the pad becomes.

Therefore, a level of the externally applied voltage to be applied to the pad PAD2 is decided by appropriately determining the cutting number of the upper and lower fuses. Therefore, a trip point of the generated mode entrance enable signal MES is controlled by the fuse trimming.

For instance, to generate the mode entrance enable signal MES when a high applied voltage is applied through the pad, the cutting number of the upper fuses is increased. To generate the mode entrance enable signal when a relatively low applied voltage is applied through the pad, the cutting number of the lower fuses is increased.

Overall operations will now be described with reference to FIGS. 2 and 3, but the descriptions given herein are exemplary only, for the purpose of providing a thorough understanding of the present invention, and not for the purpose of limitation.

Referring back to FIG. 2, assuming that a level of the operation voltage source VCC is highly unstable, a stable mode entrance enable signal MES must nevertheless be generated in order to enter the semiconductor memory device into a test mode such as a burn-in operation, etc. Stable generation of the mode entrance enable signal MES when the voltage source VCC is highly unstable will now be described, in a case that a test operator applies a first and second high voltage, respectively, to the first and second pads PAD1 and PAD2. The mode entrance enable signal MES is stably generated through the following describing operations of the circuit even though the level of the operation voltage source VCC is destabilized.

When a first voltage higher by a threshold voltage Vtp (a threshold of the PMOS transistor PM1) than the operation voltage source VCC is applied to the first pad PAD1, the PMOS transistor PM1 is turned on, and an operation enable signal of a high level is generated through the inverter IN2. Then, the current mirror type differential amplifier DA enters an operation enable state and begins a differential amplification operation. Herewith, a second voltage is applied to the second pad PAD2 as a level of a high voltage. A high voltage level is determined as a level that is the same as or higher than a level of the first voltage, which is higher than a level of the operation voltage source voltage VCC. In this case, a level of the trimming reference voltage VDO was adjusted to be higher than the level of the fixed reference voltage VREF through the pre-executed fuse trimming operation.

Assuming that a bias is determined so that the transistors NM10, NM11 within the differential amplifier DA may operate at a saturation region, and if the level of the trimming reference voltage VDO is higher than the level of the fixed reference voltage VREF, the NMOS transistor NM11 is turned on more strongly than the NMOS transistor NM10. Stated another way, the NMOS transistor NM10 is turned on less strongly than the NMOS transistor NM11. Therefore, since an amount of current flowing through the node NO3 is greater than an amount of current flowing through the node NO4, a voltage level of the node NO3 becomes lower than a voltage of a normal state. Thus, a relatively high voltage is supplied through the PMOS transistor PM10, to increase the voltage level of the node NO3. A high level voltage outputted from the node NO3 is inverted into a low level voltage through the inverter IN10, and is outputted as the mode entrance enable signal MES.

Meanwhile, if the high voltage is not applied to the first and second pads, the PMOS transistor PM1 within the operation control part 10 is turned off, to thereby generate the operation enable signal of a low level through the inverter IN2. Further, the differential amplifier DA of the current mirror type enters an operation disable state, and does not operate.

Even though a voltage slightly higher than the operation voltage source is applied to the first pad, to thereby generate the operation enable signal of a high level; if a high voltage is not applied to the second pad PAD2, a level of the trimming reference voltage VDO becomes lower than the level of the fixed reference voltage VREF, to thereby output a low level through the node NO3. Then, the mode entrance enable signal MES is outputted as a high level, and mode entrance is not allowed.

Such a circuit operates stably, even in a case that the operation voltage source VCC is destabilized. That is to say, even though the operation voltage source VCC contains a lot of noise and is highly unstable, mode entrance is not allowed unless a voltage over a predetermined voltage is applied to the first and second pads.

In the present invention, to allow mode entrance by applying a high voltage, the cutting number of the upper fuses may be increased within the voltage division part 30.

As previously mentioned, the mode entrance control circuit and method of the present invention have an advantage of stably entering a semiconductor memory device into a predetermined operating mode only when the device is insensitive to a change in a process, a temperature, or a voltage, etc., and simultaneously satisfying a constant entrance condition. Accordingly, mode entrance operation failures in a semiconductor memory device caused by peripheral influences may be prevented or minimized by the mode entrance control circuit and method of the present invention.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A mode entrance control circuit of a semiconductor memory device, comprising:
    an operation control part for generating an operation enable signal when a first voltage applied through a first pad is over a first determination voltage;
    a voltage division part for dividing a second voltage applied through a second pad to generate a trimming reference voltage; and
    a mode entrance signal generating part that operates in response to the operation enable signal, for comparing a level of an applied fixed reference voltage with a level of the trimming reference voltage and for generating a mode entrance enable signal that allows the semiconductor memory device to enter into a predetermined mode.

2. The control circuit as claimed in claim 1, wherein a level of the first and second voltages is higher than that of an operation voltage source of the semiconductor memory device.

3. The control circuit as claimed in claim 2, wherein the level of the second voltage is higher than the level of the first voltage.

4. The control circuit as claimed in claim 3, wherein the mode entrance signal generating part comprises a differential amplifier of a current mirror type for amplifying a difference between the level of the fixed reference voltage and the level of the trimming reference voltage in response to the operation enable signal.

5. The control circuit as claimed in claim 4, wherein the operation control part comprises:
    a PMOS transistor and a plurality of NMOS transistors having source-drain or drain-source channels connected in series between the first pad and a ground; and
    an inverter connected to the drain of the PMOS transistor, and an output inverter for inverting an output of the inverter.

6. The control circuit as claimed in claim 5, wherein the voltage division part comprises:
    a plurality of PMOS and NMOS transistors having source-drain or drain-source channels connected in series between the second pad and the ground; and
    upper fuses and lower fuses which can be cut by a light source.

7. The control circuit as claimed in claim 6, wherein a mode entrance is allowed only when a voltage higher than a previous voltage is applied when a cutting number of the upper fuses is increased.

8. The control circuit as claimed in claim 3, wherein the mode entrance signal generating part is constructed of a differential amplifier of a current mirror type, wherein the differential amplifier comprises:
    PMOS transistors having sources that receive in common the operation voltage source and having gates that are connected with each other;
    NMOS transistors having drains that are respectively connected with drains of the PMOS transistors; and
    an NMOS transistor having a drain that is coupled with a common source of the NMOS transistors, a source that is grounded, and a gate that receives the operation enable signal.

9. The control circuit as claimed in claim 2, wherein the level of the second voltage is equal to the level of the first voltage.

10. A method of generating a mode entrance control signal in a semiconductor memory device, comprising:
    preparing a trimming reference voltage determination part composed of a plurality of MOS transistors and fuses;
    determining a trimming reference voltage by cutting the fuses;
    applying a first voltage over a first determination voltage through a first pad, and generating an operation enable signal;
    applying a second voltage through a second pad, and generating the trimming reference voltage; and
    comparing a level of an applied fixed reference voltage with a level of the trimming reference voltage during the generation of the operation enable signal, and generating a mode entrance enable signal to allow the semiconductor memory device to enter into a predetermined mode.

11. The method as claimed in claim 10, wherein the first and second voltages have a level higher than that of an operation voltage source of the semiconductor memory device.

12. The method as claimed in claim 11, wherein the level of the second voltage is higher than the level of the first voltage.

13. The method as claimed in claim 11, wherein the level of the second voltage is equal to the level of the first level.

14. The method as claimed in claim 11, wherein the fixed reference voltage is a reference voltage generated from a reference voltage generator of the semiconductor memory device.

* * * * *